(12) United States Patent
Kashefi et al.

(10) Patent No.: US 9,236,261 B2
(45) Date of Patent: Jan. 12, 2016

(54) DEPOSITION OF TITANIUM-ALUMINUM LAYERS

(71) Applicant: GLOBALFOUNDRIES Inc., Grand Cayman (KY)

(72) Inventors: Kevin Kashefi, San Ramon, CA (US); Ashish Bodke, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/242,215

(22) Filed: Apr. 1, 2014

(65) Prior Publication Data

US 2015/0279680 A1  Oct. 1, 2015

(51) Int. Cl.
  *H01L 21/3205* (2006.01)
  *H01L 21/28* (2006.01)
  *H01L 29/49* (2006.01)
  *H01L 29/66* (2006.01)
  *H01L 21/285* (2006.01)

(52) U.S. Cl.
  CPC .... *H01L 21/28088* (2013.01); *H01L 21/28556* (2013.01); *H01L 21/28568* (2013.01); *H01L 29/4966* (2013.01); *H01L 29/66568* (2013.01)

(58) Field of Classification Search
  CPC ................. H01L 21/28088; H01L 21/823842; H01L 29/4966
  USPC .......................................... 438/590, 591, 585
  See application file for complete search history.

(56) References Cited

U.S. PATENT DOCUMENTS

| 2012/0223397 A1* | 9/2012 | Yang et al. ................... 438/591 |
| 2012/0292721 A1* | 11/2012 | Huang et al. ................. 438/591 |
| 2015/0155365 A1* | 6/2015 | Lee et al. ..................... 438/591 |

* cited by examiner

*Primary Examiner* — Cuong Q Nguyen
(74) *Attorney, Agent, or Firm* — Amerson Law Firm, PLLC (57) ABSTRACT

Transistors having a work function layer and methods of fabricating thereof are disclosed herein. The work function layer includes aluminum and titanium layers which are deposited in separate atomic layer deposition (ALD) operations. The depositions of the titanium layers and the aluminum layers may be separated by a purge operation or even performed in different ALD chambers. The work function layer may include alternating sets of titanium layers and sets of aluminum layers, thereby forming a nanolaminate structure. As such, a ratio of titanium to aluminum may be controlled and varied as needed throughout the thickness of the work function layer. For example, the work function layer may be titanium rich at the surface facing the gate dielectric in order to reduce or prevent diffusion of aluminum into the gate dielectric.

24 Claims, 7 Drawing Sheets

DEPOSITION OF TITANIUM-ALUMINUM LAYERS

BACKGROUND OF THE INVENTION

1. Field of the Invention

The present description relates generally to semiconductor devices and, more specifically, to deposition of layers containing titanium and aluminum.

2. Description of the Related Art

A typical metal-oxide-semiconductor (MOS) device includes a gate oxide layer and a poly-Si (polysilicon) layer that are patterned into a gate using lithography and etching techniques. Ion implantation may then be used to form source/drain regions in the substrate beside the gate. However, poly-Si is not an ideal gate material in advanced node applications because of its high resistance. Furthermore, poly-Si can induce gate depletion and cause voltage loss. As such, metal gates have been proposed for many advanced MOS processes. However, many materials of the metal gates may negatively impact the work functions of NMOS gates and PMOS gates. The work function characteristics often need to be adjusted by providing work function adjusting layers of material.

The present disclosure is directed to various methods of forming semiconductor devices that involves the deposition of layers containing titanium and aluminum that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Provided are MOS transistors having work function layers and methods of fabricating thereof. A work function layer includes aluminum and titanium, which may be deposited in separate atomic layer deposition (ALD) operations. For example, a set of titanium layers may be deposited before depositing any aluminum layers. Depositions of one or more titanium layers and one or more aluminum layers may be separated by at least a purge operation or even performed in different processing chambers. The work function layer may include alternating sets of titanium layers and sets of aluminum layers, thereby forming a nanolaminate structure. As such, a ratio of titanium to aluminum may be controlled and varied throughout the thickness of the overall work function layer. For example, the work function layer may be titanium rich near the surface facing the gate dielectric in order to reduce or prevent diffusion of aluminum into the gate dielectric.

In some embodiments, a method of forming a MOS transistor involves providing a substrate having a gate dielectric layer and forming a work function layer over the gate dielectric layer. This forming operation may involve depositing at least one aluminum layer using an ALD operation and depositing at least one titanium layer using a different ALD operation. In some embodiments, the two ALD operations are separated by at least a step of performing a purge cycle during which most of metal precursors are removed from the deposition chamber. The method may also involve annealing the work function layer to at least partially form $TiAl_3$ in the work function layer. In some embodiments, an atomic ratio of aluminum to titanium in the work function layer is between 1 and 5 or, more specifically, between 2 and 4, such as about 3. The work function layer may have a thickness of between about 1-50 nm. In some embodiments, annealing is performed at a temperature of between 350° C. and 500° C. for between 15 seconds and 600 seconds.

In some embodiments, forming the work function layer involves depositing multiple aluminum layers and multiple titanium layers such that a numerical ratio of the aluminum layers to the titanium layers is between about 1 and 5. In some embodiments, the work function layer has a substantially uniform distribution of titanium throughout a thickness of the work function layer. The atomic ratio of aluminum to titanium in the work function layer may be substantially the same throughout a thickness of the work function layer. In some embodiments, the atomic ratio of aluminum to titanium in the work function layer varies throughout a thickness of the work function layer. For example, the atomic ratio of aluminum to titanium in the work function layer decreases towards the gate dielectric layer. The work function layer may include a first surface facing the gate dielectric layer, and the atomic ratio of aluminum to titanium in the work function layer at the first surface is about zero. The work function layer may include a second surface facing away from the gate dielectric layer, and the atomic ratio of titanium to aluminum in the work function layer at the second surface is about zero.

In some embodiments, forming of the work function layer may also involve depositing at least one additional aluminum layer and at least one additional titanium layer using an atomic layer deposition technique after depositing the at least one aluminum layer and the at least one titanium layer. In some embodiments, the substrate also includes a capping layer disposed over the gate dielectric layer. The capping layer may include titanium nitride. In these embodiments, the work function layer is formed over the capping layer.

In some embodiments, the method also involves forming an electrode over the work function layer. In some embodiments, prior to forming the electrode over the work function layer, the method also involves forming a barrier layer over the work function layer such that the barrier layer is disposed between the electrode and the work function layer. In some embodiments, the at least one aluminum layer and the at least one titanium layer are deposited in different atomic layer deposition chambers. In some embodiments, deposition of the at least one aluminum layer and deposition of the at least one titanium layer are separated by at least one purge operation.

Also disclosed herein is a method of forming a MOS transistor that involves providing a substrate including a gate dielectric layer and a capping layer, depositing at least one titanium layer over the capping layer using an atomic layer deposition technique, depositing at least one aluminum layer over the at least one titanium layer using an atomic layer deposition technique, and annealing the work function layer to at least partially form $TiAl_3$ in the work function layer. The capping layer may include titanium nitride and may be disposed over the gate dielectric layer. A combination of the at least one aluminum layer and the at least one titanium layer is operable as a work function layer in the MOS transistor.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming semiconductor devices that involves the deposition of layers containing titanium and aluminum. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices.

The constant demand to reduce the size of integrated circuit products and transistor devices (node size reduction) demands that semiconductor manufacturing companies employ and develop new materials and processes. Specifically, complementary metal-oxide-semiconductor (CMOS) technology is currently experiencing rapid developments driven by this node size reduction. This scaling necessitates reduction in the equivalent oxide thickness (EOT) and use of high-k materials (materials with a k value of 10 or greater), such as hafnium oxide ($HfO_2$), as gate insulation layers, which in turn demands the use of specific metal gates in MOS structures and work function materials. A combination of titanium and aluminum (TiAl) is the material of choice for an NMOS work function metal. In other words, a TiAl layer may be used to dominate the work function of the gate. Additional layers may be disposed within the gate, such as a barrier layer and/or an interphase layer. The barrier layer may be used to prevent metals of the work function layer from diffusing into the substrate and other components of the MOS structures. The interphase layer may be used to adjust the work function effect/functionality of the work function layer and, in some embodiments, to enhance adhesion of the work function layer to the other components of the MOS structure.

TiAl layers and other similar types of layers are conventionally deposited using physical vapor deposition (PVD) techniques. However, PVD techniques are not readily scalable for advanced node applications. First, PVD deposited layers are often not sufficiently conformal for designed thicknesses and/or shapes. Additionally, distribution of materials within PVD deposited layers is hard to control. Furthermore, PVD deposited layers may have undesirable morphologies.

Disclosed herein are several embodiments of MOS transistors having work function layers and methods of fabricating thereof. Specifically, a work function layer includes aluminum and titanium, which are deposited in separate atomic layer deposition (ALD) operations. For example, a set of titanium layers may be deposited before depositing a set of aluminum layers or vice versa. Each set may include one or more layers. Forming a work function layer may involve depositing one or more sets of titanium layers and one or more sets of aluminum layers. Distribution of these sets of layers may be specifically controlled to achieve a desirable concentration profile of aluminum and/or titanium within the work function layer. The one or more sets of titanium layers may be deposited in one ALD chamber, while the one or more sets of aluminum layers may be deposited in a different ALD chamber. In some embodiments, deposition of both titanium and aluminum layers are performed in the same ALD chamber. However, deposition of the one or more titanium layers may be separated from the deposition of the one or more aluminum layers by performing at least a purge and pump cycle. Annealing may be used to combine titanium and aluminum so as to form $TiAl_3$.

As such, forming a work function layer may involve forming an initial stack of alternating sets of titanium layers and sets of aluminum layers, which may be referred to as a nanolaminate. The thickness of each set may be controlled by the number of layers in that set. The thickness of each layer is usually determined by saturation of a metal precursor and may be harder to control. The thickness of an aluminum set may be independently controlled from the thickness of a titanium set. Furthermore, multiple sets of each type may be provided in the same stack that is later converted into the work function layer. Independently controlled thicknesses of each set and independently controlled positioning of each set in the stack allows very fine tuning of work function characteristics of the work function layer while achieving a complete fill of the advanced node features, for example, in gate last processing schemes. Such a level of control is not achievable with PVD deposition techniques. Furthermore, ALD techniques allow for complete gap fill, whereas PVD techniques are not capable due to large overhangs and poor bottom and sidewall coverage as the device geometry shrinks.

Figure 1:
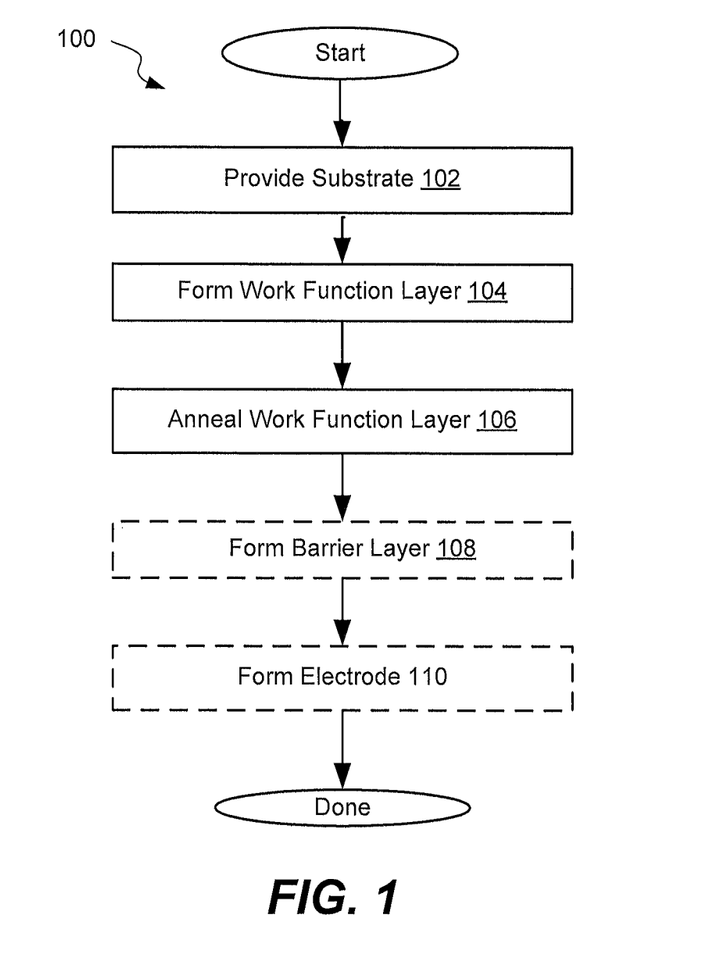
FIG. 1 illustrates a process flowchart corresponding to a method of forming a MOS transistor, in accordance with some embodiments disclosed herein.

FIG. 1 illustrates a process flowchart corresponding to one illustrative method 100 disclosed herein for forming a MOS transistor, in accordance with some embodiments disclosed herein. The method 100 may commence with providing or obtaining a substrate during operation 102. The substrate is used to deposit various components of the MOS transistor. Furthermore, the same substrate often is used to form components of multiple MOS transistors.

Figure 3A:
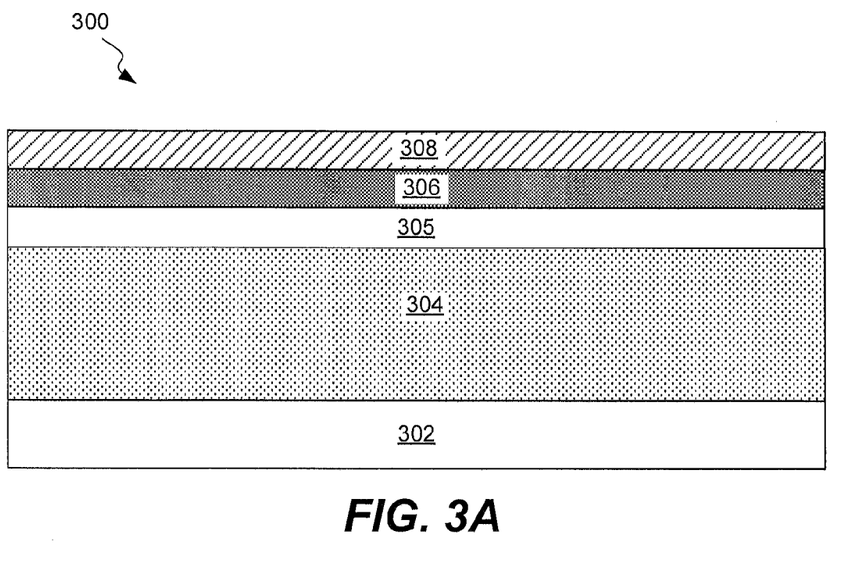
FIGS. 3A-3E illustrate schematic representations of various stages of MOS transistor fabrication, in accordance with some embodiments disclosed herein.

FIG. 3A illustrates one example of a substrate 300 that may be provided during the operation 102. Substrate 300 may include a base 302, a P-doped layer 304, and a gate dielectric or gate insulation layer 305. The base 302 may be a part of a wafer and include other devices. N-doped wells will be formed in P-doped layer 304 at a later point in processing. The P-doped layer 304 is also used to receive other components of the MOS transistor as described below. The gate dielectric 305 may be formed using, for example, a chemical vapor deposition (CVD) technique or an ALD technique. The gate dielectric 305 may include a common dielectric material like silicon dioxide or silicon nitride or high-k materials, such as hafnium silicate, zirconium silicate, hafnium dioxide and zirconium dioxide.

In some embodiments, the substrate 300 includes a barrier layer 306. In some applications, the barrier layer 306 may be formed directly on the gate dielectric layer 305. The barrier layer 306 may include titanium nitride, tantalum nitride, titanium, tantalum and various combinations thereof. For example, a titanium nitride layer may be formed using PVD or other suitable deposition techniques. The deposition of the titanium nitride layer may be performed using a titanium target in a nitrogen atmosphere maintained at a pressure of between about 1-20 mTorr. The power may be maintained at 150-500 Watts, thereby resulting in a deposition rate of about 0.5-5 Angstroms per second. These process parameters are provided as examples and generally depend on deposited materials, tools, deposition rates and other factors. Other processing techniques, such as ALD, PVD, CVD, evaporation and the like, can also be used to deposit the barrier layer.

In some embodiments, the substrate 300 also includes an interphase layer 308. The interphase layer 308 may be used for adjusting the work function characteristics of the work function layer. Specifically, the interphase layer 308 may be formed as a nucleation layer that is capable of controlling the crystal orientation of the work function layer, thereby controlling, to a certain extent, the work function characteristics of the work function layer. The interphase layer 308 can also serve as an adhesion layer between the barrier layer 306 and the work function layer. In some embodiments, the interphase layer 308 is a metallic layer and may it be formed using a deposition process, a surface treatment of the barrier layer 306, or a combination of a deposition process and a surface treatment of the deposited layer. Specifically, the interphase layer 308 may be deposited using PVD, ALD or CVD (or, more specifically, a metal-organic chemical vapor deposition (MOCVD)) processes. The surface treatment of barrier layer 306 or the post-deposition surface treatment may be a nitridation treatment.

In some embodiments, the gate dielectric 305 and other layers, if present, may be disposed within a high aspect ratio feature, such as a trench (not shown). The aspect ratio of this feature may be at least 2, at least 5, or even at least 10.

Returning to FIG. 1, the method 100 may proceed with formation of the work function layer on the substrate during operation 104. The work function layer includes aluminum and titanium and is formed using an ALD technique. This technique includes one or more cycles for each metal (i.e., aluminum and titanium). Each cycle involves the following four steps: (1) introducing one or more metal-containing precursors into the deposition chamber to form an absorbed layer; (2) purging these one or more precursors; (3) introducing reactive agents that react with the absorbed layer of the metal-containing precursors; and (4) purging the reactive agents. Selection of precursors and processing conditions depend on desired composition, morphology and structure of the work function layer. One aluminum layer or one titanium layer is formed during each ALD cycle. In some embodiments, the layer formed during each cycle may be between about 0.25 and 2 Angstroms thick. The cycle may be repeated multiple times until the work function layer reaches it desired thickness and composition. In some embodiments, the total thickness of the work function layer may be between 1-50 nm or, more specifically, between 5-30 nm. At this stage of processing, the work function layer may include one or more aluminum layers and one or more titanium layers. Distribution of these layers within the work function layer is further described below.

Certain aspects of various ALD techniques are now briefly described to provide better understanding of various processing features. In one embodiment, a titanium-containing precursor or an aluminum-containing precursor is introduced into the ALD chamber and allowed to flow over the deposition surface (which may have previously deposited ALD layers) provided therein. The one or more precursors are introduced in the form of pulses. The introduced precursor adsorbs (e.g., saturatively chemisorbs) on the deposition surface. Subsequent pulsing with a purging gas removes excess precursor from the deposition chamber. After the initial precursor pulsing and purging of one or more metal-containing precursors, a subsequent pulse introduces a reducing agent. The reducing agent reacts with the adsorbed metal-containing molecules to form substantially pure metal like Ti or Al. Reaction byproducts and excess reactants are purged from the deposition chamber. The saturation during the reaction and purging stages makes the growth self-limiting. This feature helps to improve deposition uniformity and conformality and allows more precise control of the resulting resistive switching characteristics. The temperature of the substrate during atomic layer deposition may range between about 200° C. to 350° C. The precursor may be either in gaseous phase, liquid phase or solid phase. If a liquid or a solid precursor is used, then it may be transported into the chamber by an inert carrier gas, such as helium or nitrogen.

Some examples of aluminum-containing precursors include aluminum tris(2,2,6,6-tetramethyl-3,5-heptanedionate) $(Al(OCC(CH_3)_3CHCOC(CH_3)_3)_3)$, triisobutyl aluminum $([(CH_3)_2CHCH_2]_3Al)$, trimethyl aluminum $((CH_3)_3Al)$—also known as TMA, and Tris (dimethyl amido) aluminum $(Al(N(CH_3)_2)_3)$ TEA, DMAH (dimethylaluminum hydride), TMAA (trimethylamine alane), TEAA (triethyl-amine alane, DMEAA (dimethylethylamine alane,), etc. Some examples of titanium-containing precursors include bis(tert-butylcyclopentadienyl)titanium dichloride $(C_{18}H_{26}Cl_2Ti)$, tetrakis(diethylamido)titanium $((C_2H_5)_2N)_4Ti)$, tetrakis(dimethylamido)titanium $((CH_3)_2N)_4Ti)$, tetrakis(ethylmethylamido)titanium (($CH_3C_2H_5$)N)$_4$Ti), titanium diisopropoxidebis(2,2,6,6-tetramethyl-3,5-heptanedionate) TiCl4, TiF4, TiBr$_4$, TDMAT, (Ti[OCC(CH$_3$)$_3$CHCOC(CH$_3$)$_3$]$_2$(OC$_3$H$_7$)$_2$), titanium isopropoxide (Ti (OCH(CH$_3$)$_2$)$_4$), and titanium tetrachloride (TiCl$_4$). In one illustrative embodiment, the reducing agent may include hydrogen gas (H$_2$), atomic hydrogen, hydrogen plasma or ammonia (NH$_3$).

Figure 2:
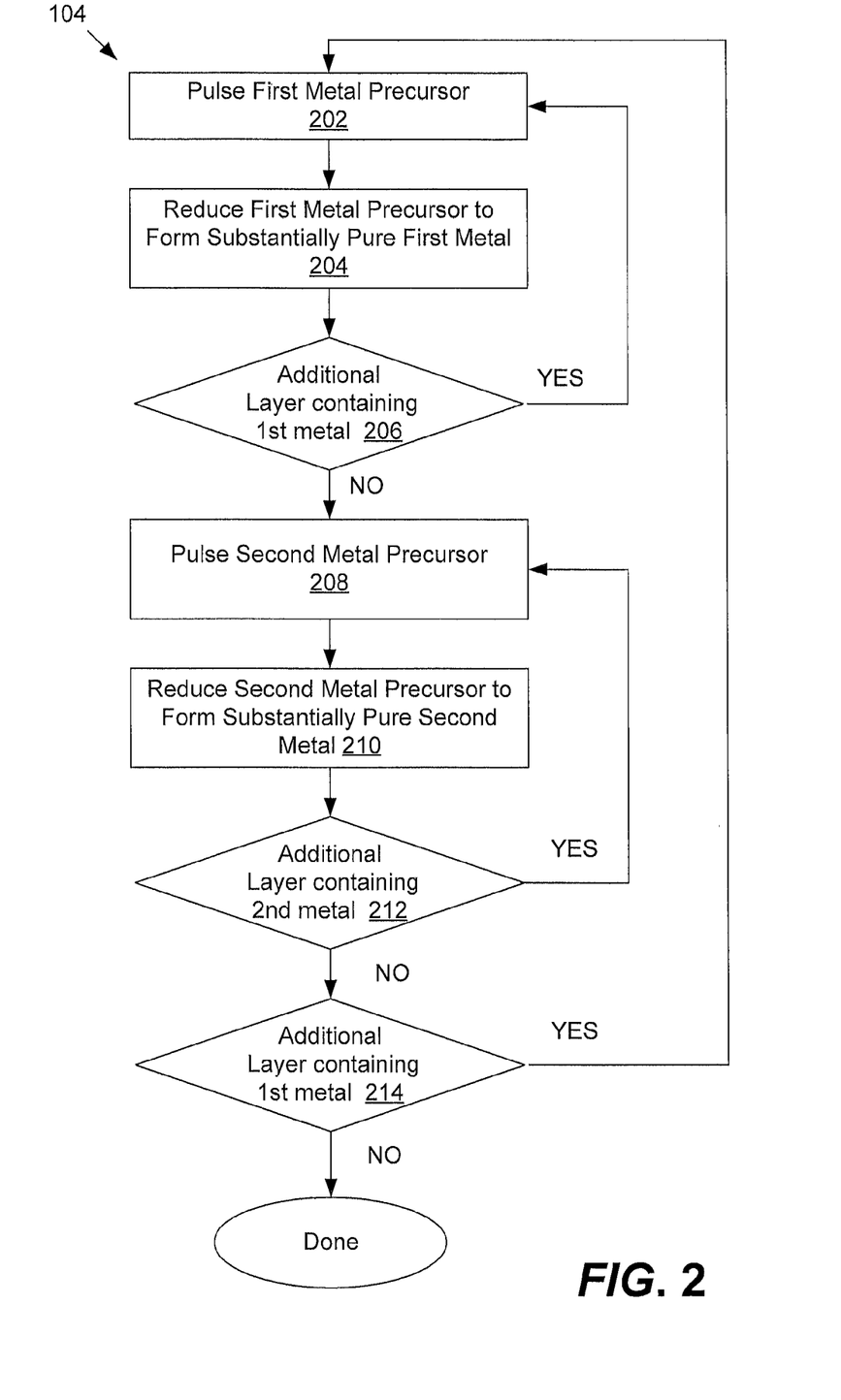
FIG. 2 further illustrates various features of the work function layer formation operation, in accordance with some embodiments disclosed herein.

Different embodiments of the operation 104 will now be explained with reference to FIG. 2. Forming the work function layer may start with pulsing of a first metal-containing precursor into the ALD chamber during sub-operation 202. The first metal-containing precursor may include titanium or aluminum. The titanium-containing precursor is introduced to the chamber as a pulse. A purge gas may be provided continuously with the pulse or may be discontinued during the pulse. The purge gas is non-reactive or inert at given process conditions and may include nitrogen (N$_2$) or helium (He). At least a portion of the precursor adsorbs onto or reacts with the surface of the bottom electrode. Adsorption of the precursor depends on the availability of adsorption sites. When these sites are all consumed (i.e., a fully saturated processing layer is formed), no more metal-containing precursor can adsorb, and any remaining precursor is removed by purging.

Once the first metal-containing precursor is adsorbed on the deposition surface and remaining portions of the precursor are purged from the chamber, forming the work function layer may proceed with reduction of the adsorbed metal-containing precursor during operation 204 so as to form a substantially pure layer of the first metal. In this operation, a pulse of a reducing agent is provided to the deposition chamber. The reducing agent reacts with the metal-containing precursor remaining on the substrate and forms a metal film. The reducing agent is then purged from the deposition chamber. This cycle may be repeated until the desired thickness of the layer containing the first metal is formed, as reflected by decision block 206.

The process then continues with pulsing of a second metal precursor into the chamber during operation 208. This precursor contains a different metal than the first metal-containing precursor used in operation 202. For example, if a titanium-containing precursor was used in operation 202, then an aluminum-containing precursor will be used in used in sub-operation 208. The second metal-containing precursor is then reduced to form a second metal layer during operation 210 so as to form a substantially pure layer of the second metal. This cycle may be repeated until the desired thickness of the layer containing the second metal is formed, as reflected by decision block 212. A number of cycles that involve depositing the first metal layer and a number of cycles depositing the second metal layer are controlled to achieve a specific composition of the work function layer and control the distribution of titanium and aluminum in the layer. The overall process of forming the first metal layer and forming the second metal layer may be repeated any number of times until the overall layer reaches a predetermined thickness, as reflected by the decision block 214. This approach may be referred to as nano-lamination ALD, in which multiple layers of two different metals (i.e., aluminum and titanium) form the stack of materials that define the work function layer.

Figure 3B:
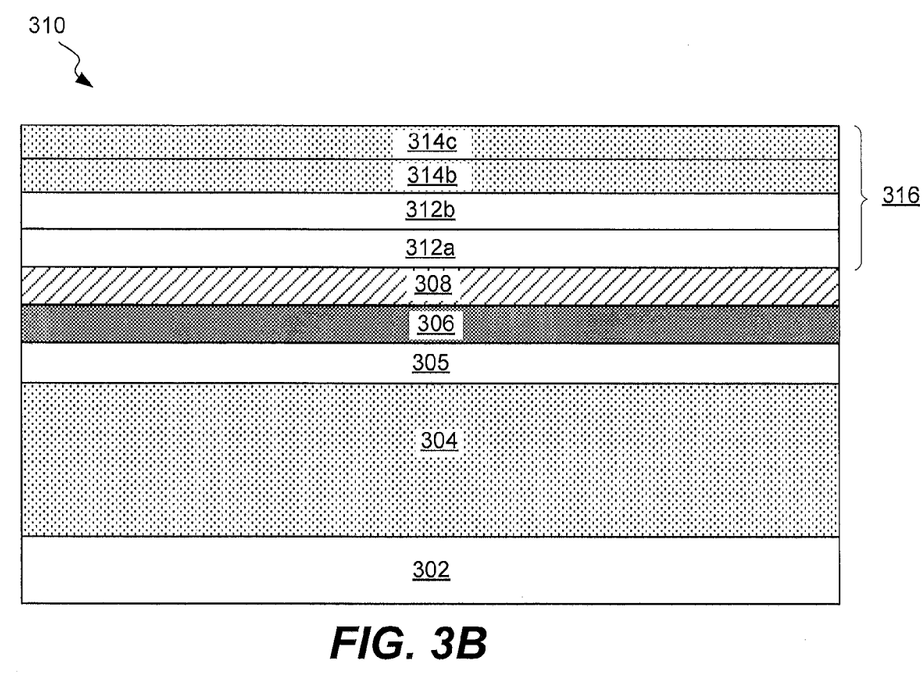

FIG. 3B is a schematic illustration of a MOS subassembly 310 after depositing one or more aluminum layers 312a-b and one or more titanium layers 314b-c, in accordance with some embodiments disclosed herein. One or more aluminum layers 312a-b and one or more titanium layers 314b-c are parts of a partially fabricated work function layer 316 at this stage of processing. Partially fabricated work function layer 316 may then be converted into a work function layer by subjecting partially fabricated work function layer 316 to further processing, such as annealing. While FIG. 3B illustrates two aluminum layers 312a-b and two titanium layers 314b-c, the formation of any number of titanium layers and any number of aluminum layers is within the scope of the inventions set forth herein. In general, at least one aluminum layer and at least one titanium layer are formed during the operation 104. In some embodiments, the number of the aluminum layers formed is between 1 and 5, and the number of the titanium layers formed is between about 1 and 5.

Furthermore, even though FIG. 3B illustrates aluminum layers 312a-b facing the gate dielectric 305, any distribution of one or more aluminum layers and one or more titanium layers may be created during operation 104. In turn, this distribution of layers controls distribution of aluminum and titanium within the resulting work function layer, as will now be explained with reference to FIG. 4.

Figure 4:
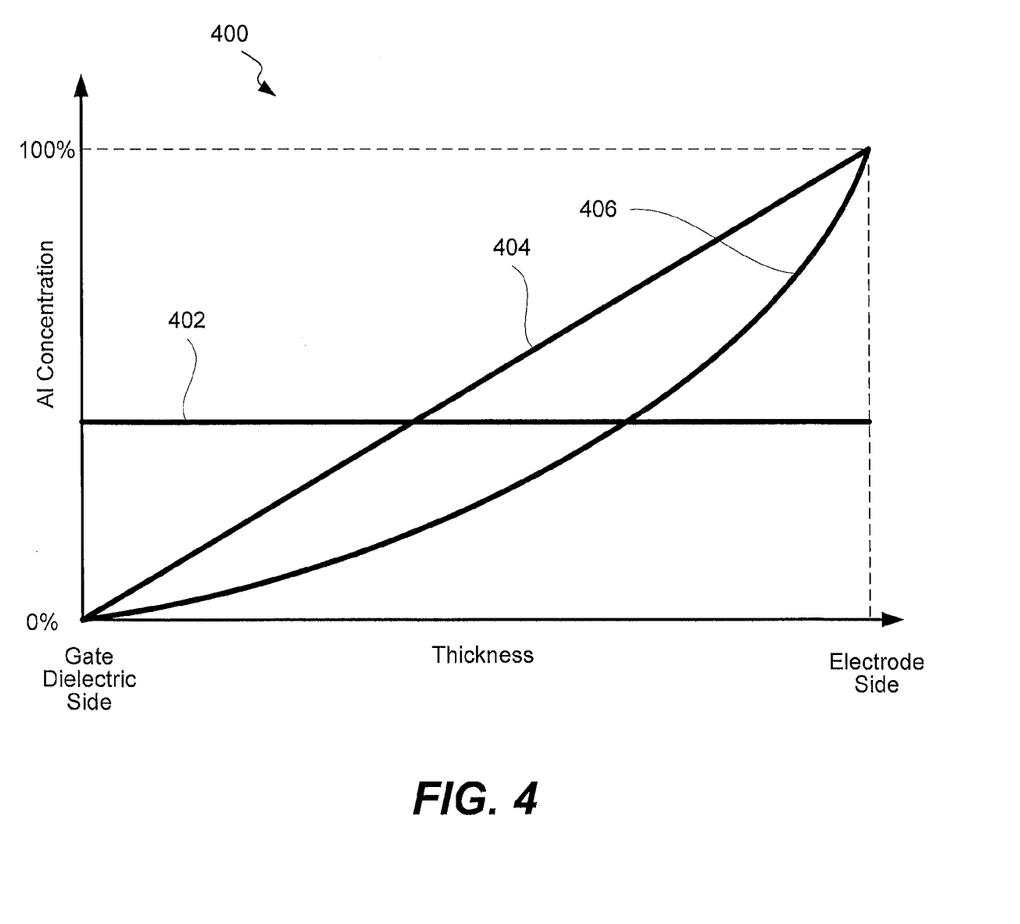
FIG. 4 illustrates plots of aluminum concentrations in a work function layer, in accordance with some embodiments disclosed herein.

FIG. 4 illustrates a plot 400 of various aluminum concentration profiles 402-406 as a function of the thickness of different work function layers, in accordance with some embodiments disclosed herein. Profile 402 illustrates an approximately even distribution of aluminum within the work function layer. In other words, the concentration of aluminum in this work function layer is substantially the same throughout the thickness of the work function layer. In some embodiments disclosed herein, the concentration of titanium in this work function layer is also substantially the same throughout the thickness of the work function layer. For example, the work function layer may be formed substantially of aluminum and titanium and may include less than 1% atomic of other elements.

In some embodiments disclosed herein, the concentration of aluminum may vary throughout the thickness of the work function layer. The concentration of titanium may also vary throughout the thickness of the work function layer. For example, the work function layer may have substantially no aluminum at the gate dielectric side and substantially no titanium at the electrode side. The profile 404 illustrates a gradual increase in the concentration of aluminum from the gate dielectric side of the work function layer on one side to the electrode side of the work function layer. Profile 406 illustrates an exponential increase in concentration of aluminum as the thickness of the work function layer increases. These profiles represent illustrative distribution of metals in the final work function layer (e.g., after annealing). The actual profiles may not be as smooth due to the nano-lamination nature of the deposition.

The relative concentrations of aluminum and titanium in the work function layer may vary depending upon the particular application, e.g., the Ti/Al ratio can be changed for about 0-1 depending upon the particular requirements for the work function layer. For example, in some embodiments, the work function layer includes between about 20-80 atomic weight % of aluminum with the remaining portion being titanium.

Figure 3C:
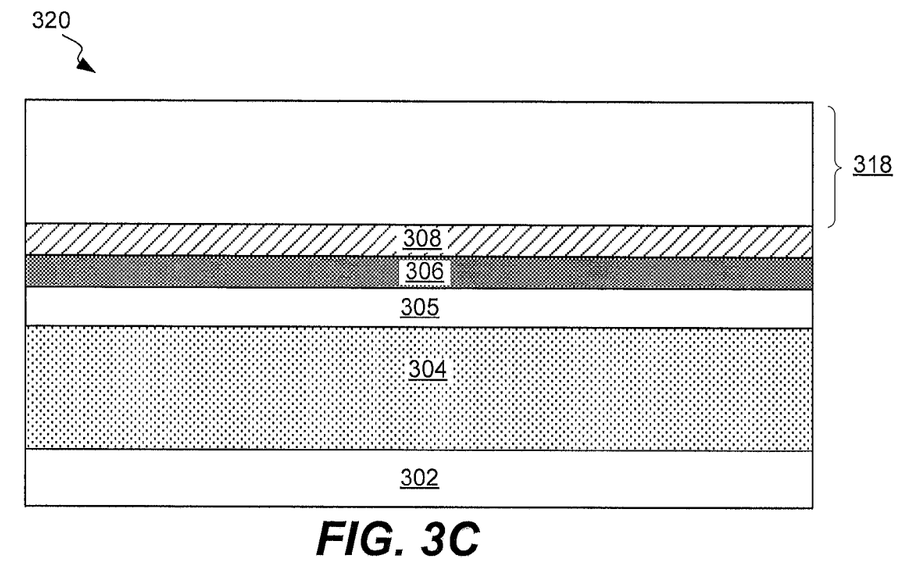

Returning to FIG. 1, after forming the work function layer during operation 104 or, more specifically, depositing one or more aluminum layers and one or more titanium layers, the method 100 may continue with the step of annealing the work function layer during operation 106. During annealing, some aluminum and titanium diffuse within the work function layer and at least partially form TiAl3 in the work function layer. In one embodiment, the annealing step may be performed at a temperature that falls within the range of between 350° C. and 500° C. for between 15 seconds and 600 seconds. In another embodiment, an annealing process like a laser annealing process may be performed for a shorter duration at a more elevated temperature, e.g., a millisecond anneal process performed at a temperature of about 900° C. FIG. 3C illustrates a partially fabricated MOS device 320 after anneal operation 106. However, as will be appreciated by those skilled in the art, the post-anneal work function layer 318 may not have clear boundaries between aluminum layers and titanium layers.

Figure 3D:
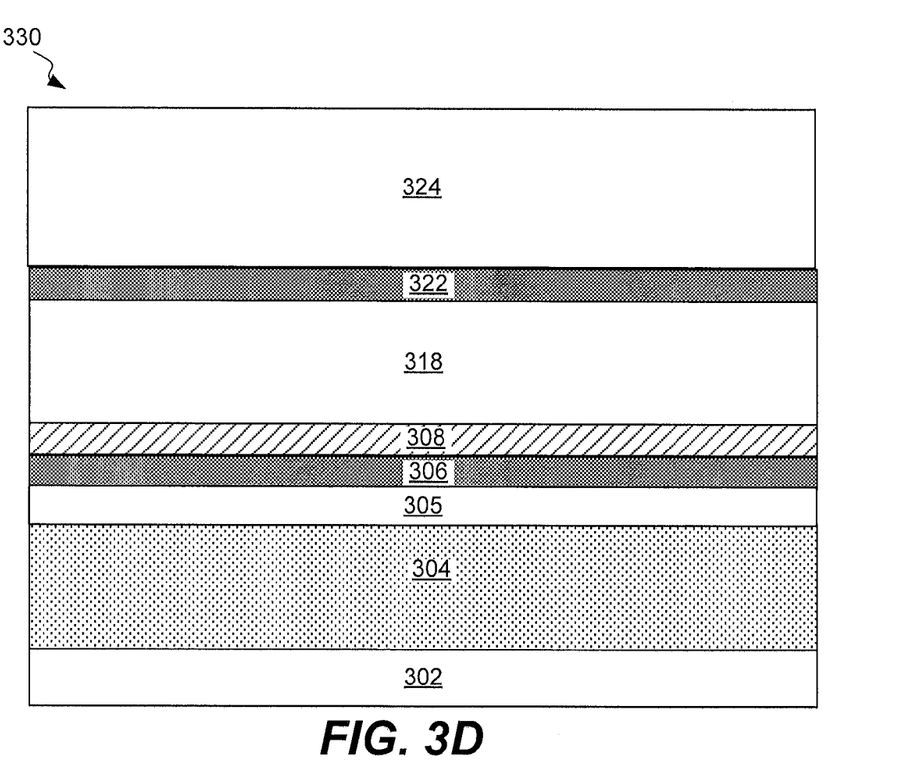

Returning to FIG. 1, the method 100 may proceed with optional operation 108, during which a top barrier layer is formed above the post-anneal work function layer 318, and an optional operation 110, during which an electrode material is formed above the post-anneal work function layer 318. FIG. 3D illustrates a partially fabricated MOS device 330 depicting the top barrier layer 322 and the top electrode layer 324 after the operations 108 and 110 were performed. In some embodiments, the operation 108 is not performed, and the electrode material is formed directly on the post-anneal work function layer 318 (a situation that is not depicted in the attached drawings). The process may continue with formation of other components of the MOS device using traditional manufacturing techniques.

Figure 3E:
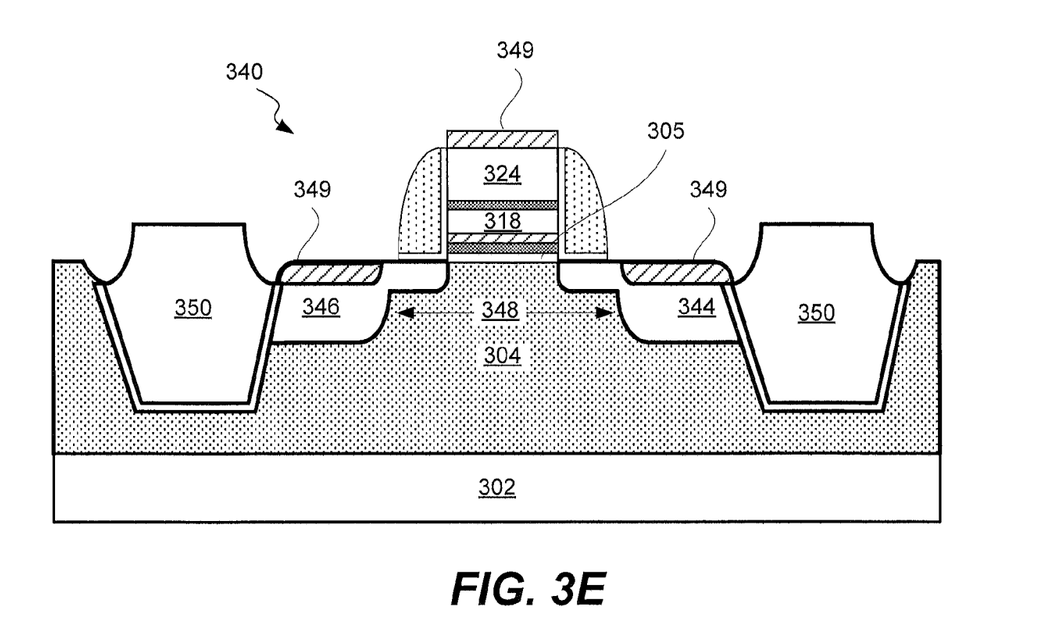

FIG. 3E depicts a complete view of an illustrative NMOS device 340, which includes a P-doped well 304. The P-doped well 304 may include any suitable P-type dopants, such as boron and indium, and may be formed by any suitable technique. The NMOS device 340 also includes an N-doped source region 344 and an N-doped drain region 346 (or simply the source and drain) disposed in the P-doped well 304. The source 344 and drain 346 regions are located on each side of gate electrode 324 and a channel 348 is formed between the source/drain regions within the P-doped well 304. The source region 344 and drain region 346 may include N-type dopants, such as phosphorus and arsenic, and may be formed by any suitable technique. The source region 344 and the drain region 346 may be formed by ion implantation.

The NMOS device 340 also includes a conductive gate electrode 324 that is separated from the P-doped well 304 by the gate dielectric 305 and the post-anneal work function layer 318.

In some embodiment, the source region 344, the drain region 346 and the gate electrode 324 are covered with a layer of self-aligned silicide portions 349, which may be also referred to as salicide portions or simply salicides. For example, a layer of cobalt may be deposited as a blanket film and then thermally treated to form these silicide portions or regions 349. Other suitable materials include nickel and other refractory metals, such as tungsten, titanium, platinum and palladium.

The NMOS device 340 may also include illustrative STI structures 350 disposed on both sides of the source region 344 and the drain region 346. The STI structures 350 may include liners formed on the side and bottom walls by, for example, thermal oxidation of silicon of the P-doped well 304. The main body of the STI structures 350 is formed by filling a trench within the P-doped well 304 with a dielectric material, such as silicon oxide. The silicon oxide may be filled using a high density plasma (HDP) deposition process.

Figure 5:
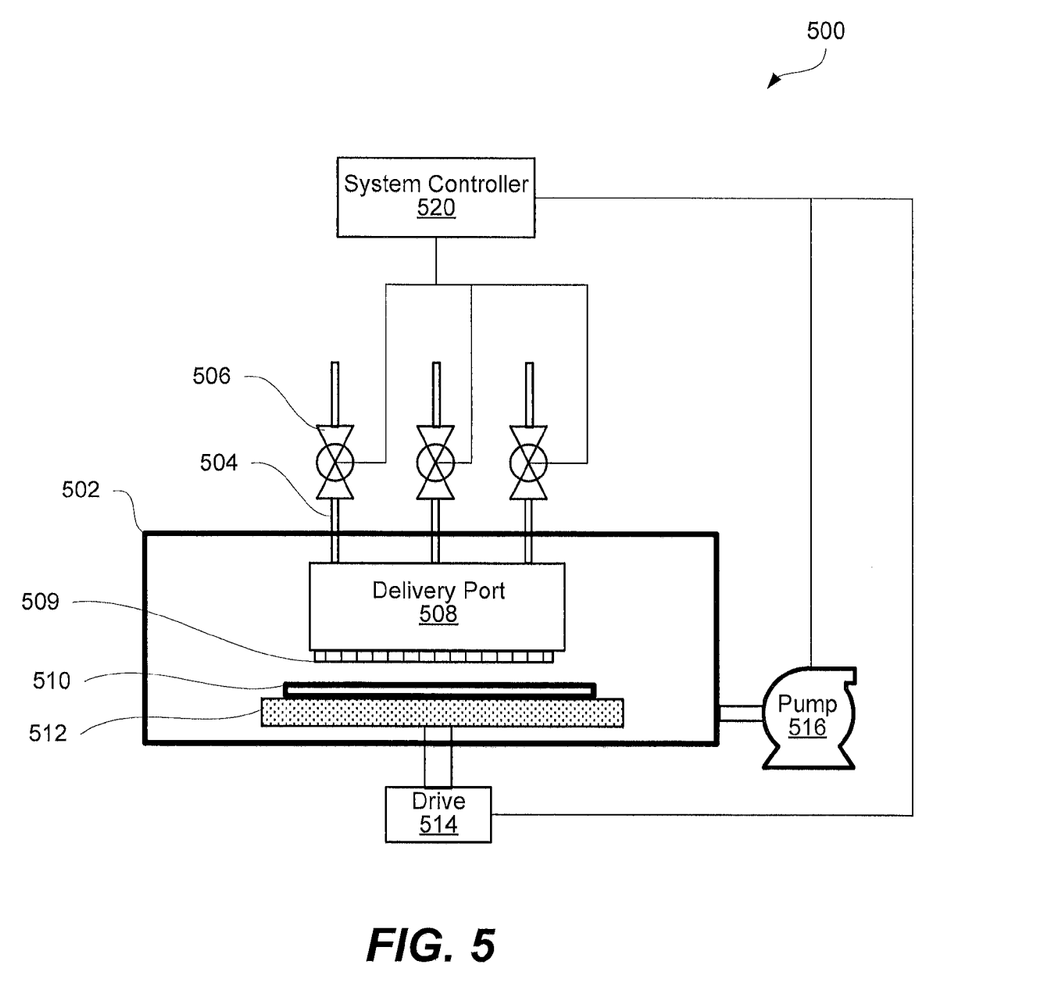
FIG. 5 illustrates a schematic representation of an atomic layer deposition apparatus for fabricating a MOS transistor, in accordance with some embodiments disclosed herein.

FIG. 5 illustrates a schematic representation of an atomic layer deposition apparatus 500 for fabricating MOS devices, in accordance with some embodiments disclosed herein. For clarity, some components of apparatus 500 are not included in this figure, such as a wafer-loading port, wafer lift pins, and electrical feed throughs. The apparatus 500 includes a deposition chamber 502 connected to processing gas delivery lines 504. While FIG. 5 illustrates three delivery lines 504, any number of delivery lines may be used. Each delivery line 504 may be equipped with a valve and/or mass flow controller 506 for controlling the delivery rates of processing gases into the deposition chamber 502. In some embodiments, gases are provided into delivery port 508 prior to exposing the substrate 510 to processing gases. The delivery port 508 may be used for premixing gases (e.g., precursors and diluents) and to provide for even distribution of gases over the surface of the substrate 510. The delivery port 508 is sometimes referred to as a showerhead. The delivery port 508 may include a diffusion plate 509 having multiple holes for gas distribution.

The deposition chamber 502 encloses substrate support 512 for holding the substrate 510 during its processing. The substrate support 512 may be made from a thermally conducting metal (e.g., W, Mo, Al, Ni) or other like materials (e.g., a conductive ceramic) and it may be used to maintain the substrate temperature at desired levels. The substrate support 512 may be connected to a drive 514 for moving the substrate 510 during loading, unloading, process set up, and sometimes even during processing. The deposition chamber 502 may be connected to a vacuum pump 516 for evacuating reaction products and unreacted gases from the deposition chamber 502 and for maintaining a desirable pressure inside the chamber 502.

The apparatus 500 may include a system controller 520 for controlling process conditions during various deposition processes. The controller 520 may include one or more memory devices and one or more processors with a central processing unit (CPU) or computer, analog and/or digital input/output connections, a stepper motor controller boards, and the like. In some embodiments, the controller 520 executes system control software including sets of instructions for controlling timing, gas flows, chamber pressure, chamber temperature, substrate temperature, radio frequency (RF) power levels (if RF components are used, e.g., for process gas dissociation) and other parameters. Other computer programs and instruction stored on memory devices associated with the controller may be employed in some embodiments.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method of forming a metal oxide semiconductor (MOS) transistor, the method comprising:
   forming a gate dielectric layer on a semiconductor substrate;
   forming a work function layer above said gate dielectric layer by depositing at least one aluminum layer and at least one titanium layer using an atomic layer deposition technique, wherein the deposition of said at least one aluminum layer and the deposition of said at least one titanium layer are separated by at least one purge operation; and annealing said work function layer to at least partially form TiAl₃ in said work function layer.

2. The method of claim 1, wherein an atomic ratio of aluminum to titanium in said work function layer is between 1 and 5.

3. The method of claim 1, wherein an atomic ratio of aluminum to titanium in said work function layer is between 2 and 4.

4. The method of claim 1, wherein an atomic ratio of aluminum to titanium in said work function layer is about 3.

5. The method of claim 1, wherein said work function layer has a thickness of between about 1-50 nm.

6. The method of claim 1, wherein forming said work function layer comprises depositing multiple aluminum layers and multiple titanium layers, wherein a ratio of a number of the aluminum layers to a number of the titanium layers is between about 1 and 5.

7. The method of claim 1, wherein said work function layer has a substantially uniform distribution of titanium throughout a thickness of said work function layer.

8. The method of claim 1, wherein an atomic ratio of aluminum to titanium in said work function layer is substantially the same throughout a thickness of said work function layer.

9. The method of claim 1, wherein an atomic ratio of aluminum to titanium in said work function layer varies throughout a thickness of said work function layer.

10. The method of claim 9, wherein the atomic ratio of aluminum to titanium in said work function layer decreases towards said gate dielectric layer.

11. The method of claim 10, wherein said work function layer comprises a first surface that contacts said gate dielectric layer and wherein the atomic ratio of aluminum to titanium in said work function layer at said first surface is about zero.

12. The method of claim 10, wherein said work function layer comprises a second surface facing away from said gate dielectric layer and an atomic ratio of titanium to aluminum in said work function layer at said second surface is about zero.

13. The method of claim 1, wherein, after depositing said at least one aluminum layer and said at least one titanium layer, forming said work function layer further comprises depositing at least one additional aluminum layer and at least one additional titanium layer using an atomic layer deposition technique.

14. The method of claim 1, wherein said annealing is performed at a temperature of between 350° C. and 500° C. for between 15 seconds and 600 seconds.

15. The method of claim 1, wherein said substrate further comprises forming a capping layer on said gate dielectric layer, said capping layer comprising titanium nitride and wherein said work function layer is formed on said capping layer.

16. The method of claim 1, further comprising forming an electrode material over said work function layer.

17. The method of claim 16, further comprising, prior to forming said electrode material over said work function layer, forming a barrier layer over said work function layer such that said barrier layer is disposed between said electrode material and said work function layer.

18. The method of claim 1, wherein said at least one aluminum layer and said at least one titanium layer are deposited in different atomic layer deposition chambers.

19. The method of claim 1, wherein said work function layer is formed on and in contact with said gate dielectric layer.

20. The method of claim 1, wherein forming said work function layer involves using a reducing agent during the act of forming said work function layer.

21. A method of forming a metal oxide semiconductor (MOS) transistor, the method comprising:

forming a gate dielectric layer above a semiconductor substrate;

forming a capping layer comprised of titanium nitride on and in contact with said gate dielectric layer;

depositing at least one titanium layer above said capping layer, wherein depositing said at least one titanium layer comprises using a reducing agent during an atomic layer deposition technique;

depositing at least one aluminum layer above said at least one titanium layer, wherein depositing said at least one aluminum layer comprises using a reducing agent during an atomic layer deposition technique, and wherein a combination of said at least one aluminum layer and said at least one titanium layer forms a work function layer in the MOS transistor; and annealing said work function layer to at least partially form TiAl₃ in said work function layer.

22. The method of claim 21, further comprising performing at least one purging operation after depositing said at least one titanium layer and prior to forming said at least one aluminum layer.

23. A method of forming a metal oxide semiconductor (MOS) transistor, the method comprising:

forming a gate dielectric layer on a semiconductor substrate;

forming a work function layer above said gate dielectric layer by depositing at least one aluminum layer and at least one titanium layer using an atomic layer deposition technique, wherein forming said work function layer involves using a reducing agent during the act of forming said work function layer; and annealing said work function layer to at least partially form TiAl₃ in said work function layer.

24. A method of forming a work function metal layer stack above a semiconductor substrate, the method comprising:

forming a first metal layer above said semiconductor substrate, wherein forming said first metal layer comprises:
performing a first pulse step to expose said semiconductor substrate to a first metal precursor;
performing a first purge step to purge at least a portion of said first metal precursor;
performing a second pulse step to expose said semiconductor substrate to a first reducing agent; and
performing a second purge step to purge at least a portion of said first reducing agent; and forming a second metal layer above said first metal layer, wherein forming said second metal layer comprises:
performing a third pulse step to expose said first metal layer to a second metal precursor;
performing a third purge step to purge at least a portion of said second metal precursor;
performing a fourth pulse step to expose said first metal layer to a second reducing agent; and
performing a fourth purge step to purge at least a portion of said second reducing agent.

* * * * *